United States Patent [19]

Hollingsead et al.

[11] 4,236,190
[45] * Nov. 25, 1980

[54] ELECTRICAL CONNECTOR STRUCTURE

[75] Inventors: Robert A. Hollingsead, Yorba Linda; Abraham Kuchler; Clyde R. Pryor, both of Anaheim, all of Calif.

[73] Assignee: Hollingsead-Pryor Enterprises, Inc., Santa Fe Springs, Calif.

[*] Notice: The portion of the term of this patent subsequent to Feb. 21, 1995, has been disclaimed.

[21] Appl. No.: 911,065

[22] Filed: May 31, 1978

Related U.S. Application Data

[63] Continuation of Ser. No. 613,348, Sep. 15, 1975, which is a continuation-in-part of Ser. No. 535,288, Dec. 23, 1974, abandoned.

[51] Int. Cl.³ .............................................. H02G 1/02
[52] U.S. Cl. ............................... 361/391; 339/75 MP
[58] Field of Search ............ 361/415, 391; 339/64 M, 339/65, 75 R, 75 MP; 200/51.07–51.09, 50 B; 339/217 M, 176 R, 176 M, 60 M, 217 S

[56] References Cited

U.S. PATENT DOCUMENTS

| Re. 28,171 | 9/1974 | Anhalt | 339/75 M |
|---|---|---|---|
| 3,094,364 | 6/1963 | Lingg | 339/65 |
| 3,478,301 | 11/1969 | Conrad et al. | 339/75 MP |
| 3,488,623 | 7/1970 | Stephenson et al. | 339/64 M |
| 3,745,512 | 7/1973 | Johnson et al. | 339/66 M |
| 3,848,222 | 11/1974 | Lightner | 339/75 M |
| 3,853,379 | 12/1974 | Goodman et al. | 361/415 |
| 3,977,749 | 8/1976 | Langenbach | 339/91 R |
| 4,075,444 | 2/1978 | Hollingsead et al. | 200/51.09 |

FOREIGN PATENT DOCUMENTS

| 2014868 | 10/1971 | Fed. Rep. of Germany | 339/75 M |
|---|---|---|---|
| 580397 | 8/1958 | Italy | 200/51.09 |
| 920572 | 3/1963 | United Kingdom | 361/415 |
| 1274311 | 5/1972 | United Kingdom | 361/415 |

Primary Examiner—David Smith, Jr.
Attorney, Agent, or Firm—Jackson, Jones & Price

[57] ABSTRACT

An electrical connector structure is disclosed having combined in each of its male and female mating shells both interengaging electric terminals which make co-axial, or pin-and-socket, contact by telescoping movement and interengaging low insertion force electric terminals which make side contact by relative transverse movement. The connector shells are designed to be supported on a readily removable modular unit and on a backplate of a supporting shelf on which the modular unit is mounted, the shells being located near the interface of the modular unit and shelf. Movement of the unit on the shelf toward the backplate causes guiding interengagement of the male and female shells.

14 Claims, 9 Drawing Figures

FIG_2

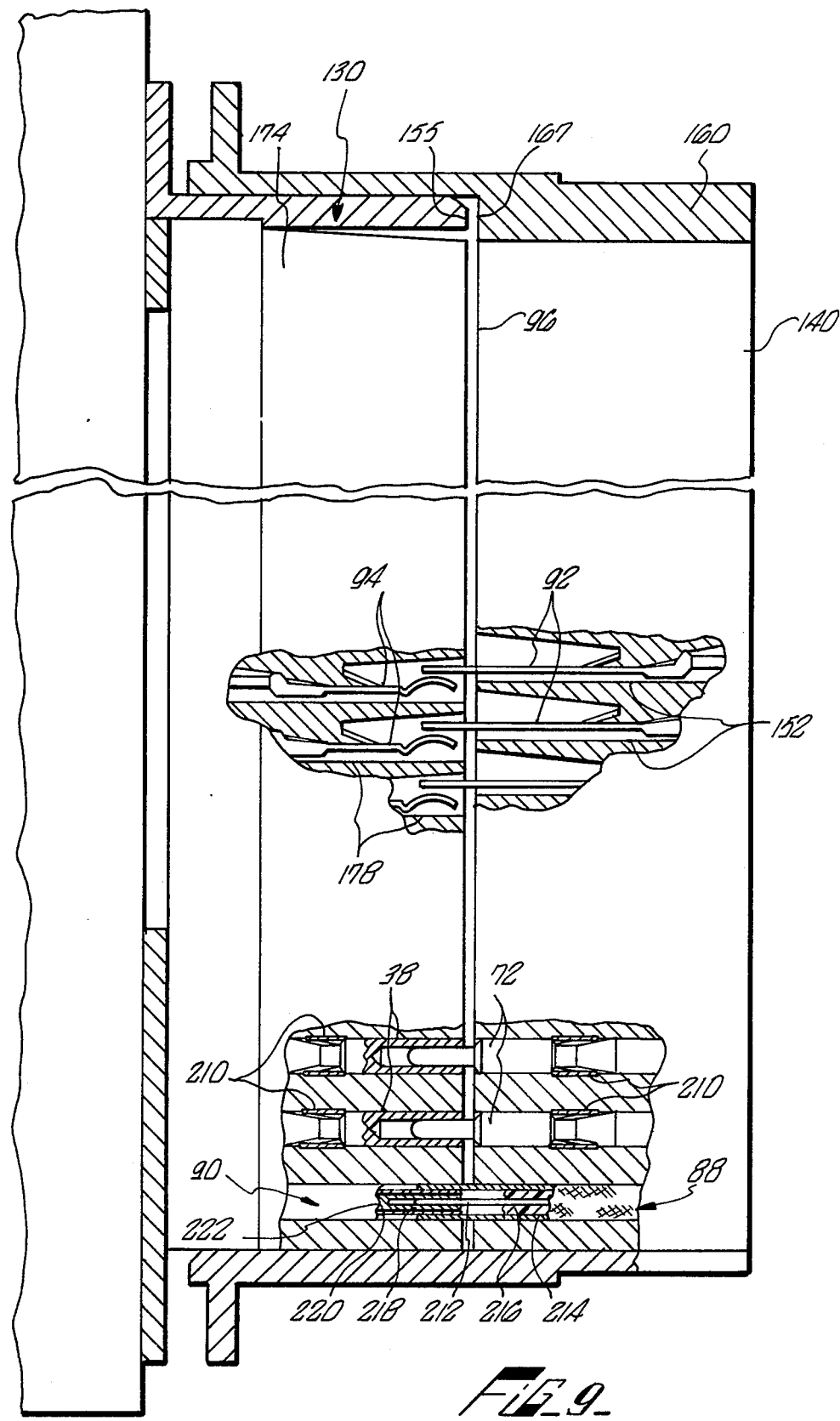

ELECTRICAL CONNECTOR STRUCTURE

REFERENCE TO RELATED APPLICATION

This is a continuation of application Ser. No. 613,348, filed Sept. 15, 1975 which is a continuation-in-part of application Ser. No. 535,288 filed Dec. 23, 1974, now abandoned.

BACKGROUND OF THE INVENTION

This invention relates to electrical connector systems having mating portions which are brought together to provide a plurality of interengaging electrical contacts. Such systems are used to facilitate connection and disconnection of electronic components. They commonly are designed to be used in conjunction with a "box-and-tray" arrangement, or "racking" system, in which a modular electronic control or communication unit enclosed in a suitable container is mounted on, and supported by, a shelf, or rack, which is secured in place in the environment into which the modular electronic unit is to be inserted. For example, modern aircraft are supplied with such trays, which are normally retained in position on the aircraft, and which are adapted to receive and support boxes containing modular electronic units, such as radio communication units, aircraft instrumentation and component control units, etc. Such modular units are sometimes referred to as "line removal units", or "LRU's". When servicing is required, a given box is removed from the tray and replaced by another. The connection and disconnection of the box, in order to be quickly and efficiently accomplished, requires mating electrical connector sections, one mounted on the tray and wired to the permanent aircraft electrical and electronic systems, and the other mounted on the box and wired to the electrical and electronic systems contained in the box. Each mating connector section carries a number of electrical terminals adapted to engage corresponding electrical terminals on the other.

As is indicated by the prior art patents identified in our related copending application Ser. No. 535,288, numerous efforts have been made to deal with the problem of excessive force needed to bring conventional connector mating sections into engagement, a problem which has grown exponentially as the number of interengaging terminals has proliferated due to the expanding requirements of modern, increasingly sophisticated electronic equipment. As the number of electric terminals in a connector unit increases, there is a serious buildup of all of the forces due to the friction and resilient pressure required in each set of interengaging terminals to insure good contact. As pointed out in a pamphlet titled "Finding the Gremlins in Aircraft Electronic Systems", authored by one of the co-inventors of this application, engaging forces and tolerance buildup resistances related to connector mating problems can result in failure of terminals to establish proper contact and in damaged connectors. This is a significant cause of aircraft functional difficulties.

A proposed solution to this problem is low, or zero, insertion force electrical connectors. In such connectors the contact terminals are not in axial alignment with their corresponding terminals as the two connector mating portions are brought together by relative motion toward one another. Instead, the opposing are laterally spaced until the mating portions have been brought together; and thereafter the set of terminals in one portion is moved laterally, or sideward, into engagement (and therefore electrical contact) with the corresponding terminals in the other portion.

The low insertion force arrangement is designed to minimize the resistance to interengaging movement of the two connector mating sections which otherwise would result from the sum of all the terminal mating forces plus extra resistances caused by any misalignment problems in the connector system.

While low insertion force concepts are very useful in solving the problems experienced with electrical connector systems, we have concluded that the low insertion force solution, of itself, is not sufficient. For one thing, as explained in our related copending application Ser. No. 535,288, we believe an automatic terminal engaging device is necessary to minimize the likelihood of connector functional failure due to human errors. In prior art systems, a separate act by the installer is needed to engage the terminals after the mating portions have been brought together. It is clearly better to minimize the possibility of human errors of omission or comission by making the system as automatic and infallible as possible.

Furthermore, we believe it is necessary to provide connector portions which combine within a single housing, or shell, low insertion force terminals and axially, or telescopically, engaging pin-and-socket terminals in a unitary connector package. We are convinced that low insertion force terminals are not adequate to carry the amperage required by power terminals, and that such terminals cannot be conveniently designed to provide interconnectiion of co-axial conductors which may be needed for high frequency signals. While it has been proposed that such power and co-axial terminals should be "wired around", i.e., electrically connected independently of the low insertion force terminals, the need for a simple, "one-shot", fool-proof method of installing replacement boxes necessitates a unitary connector mating portion which provides the advantages of low insertion force connectors without requiring the time-consuming and errorprone connection and disconnection of separate circuits which cannot be adequately handled by the contacts in low insertion force connectors.

SUMMARY OF THE INVENTION

In order to provide an electrical connector system which will have outstanding simplicity and ease in connection and disconnection, and a minimum of opportunity for either human errors or product design to cause connector failures, we have developed plug and receptacle connectors each of which supports within a single housing, or shell, two sets of electrical terminals, the first set of which is adapted to engage the corresponding set of terminals in the other housing by moving co-axially, or telescopically, with respect thereto, and the second set of which is adapted to engage the corresponding set of terminals in the other housing by lateral, or sideward, motion with respect thereto. In order to provide the relative lateral motion required for bringing the second set of terminals into engagement with its corresponding terminals, a laterally, or transversely, movable support is slidingly mounted within one of the housings and supports thereon the second set of terminals located in that housing. The first set of terminals in each housing preferably provides one or more electrical power paths and one or more low energy co-axial paths. And the second set of terminals in each housing preferably provides a substantial number of data, or instrumentation, signal paths.

The guiding means which insures that the first set of terminals in one housing will properly mate with the first set of terminals in the other housing preferably is the mating relationship of the two housings, i.e., engagement of the outer periphery of the housing of the plug, or male, portion of the connector with the inner periphery of the housing of the receptacle, or female, portion of the connector. The first set of terminals, i.e., the power and co-axial terminals, should be supported with enough lost motion in at least one housing to relieve any misalignment stresses. The second set of terminals, i.e., the low-insertion force terminals, in at least one housing should have sufficient lateral resilience to compensate for any misalignments, or alignment variations, of individual mating terminals.

Those terminals which require insertion of extraction forces when the connector housings are mated, or separated, i.e., the first set of terminals in each housing (which are preferably of the pin-and-socket type) should be located near the bottom of the respective housings, i.e., near the interface of the modular unit and shelf, in order to be relatively close to the positions of maximum strength and minimum deflection of the modular unit and shelf on which the respective connector housings are mounted, and also close to the line of force of the retaining mechanism which locks the modular unit in position on the shelf.

BRIEF DESCRIPTION OF THE DRAWINGS

FIG. 5 is a view, in perspective, of the plug, or male, mating portion, or shell, of the connector;

FIG. 6 is a view, in perspective, of the receptacle, or female, mating portion, or shell, of the connector.

FIG. 7 is a vertical cross-sectional view showing the male and female connector portions, or shells, in engagement with one another, but prior to inter-engagement of those terminals which are relatively movable laterally, or transversely, into contact position;

FIG. 8 is a vertical cross-section similar to FIG. 7 showing the mating connector portions, or shells, after inter-engagement of those terminals; and FIG. 9 is a vertical cross-sectional view similar to FIGS. 7 and 8, except that the telescoping terminals are shown in their inter-engaged positions.

DETAILED DESCRIPTION OF THE PREFERRED EMBODIMENT

Figure 1:
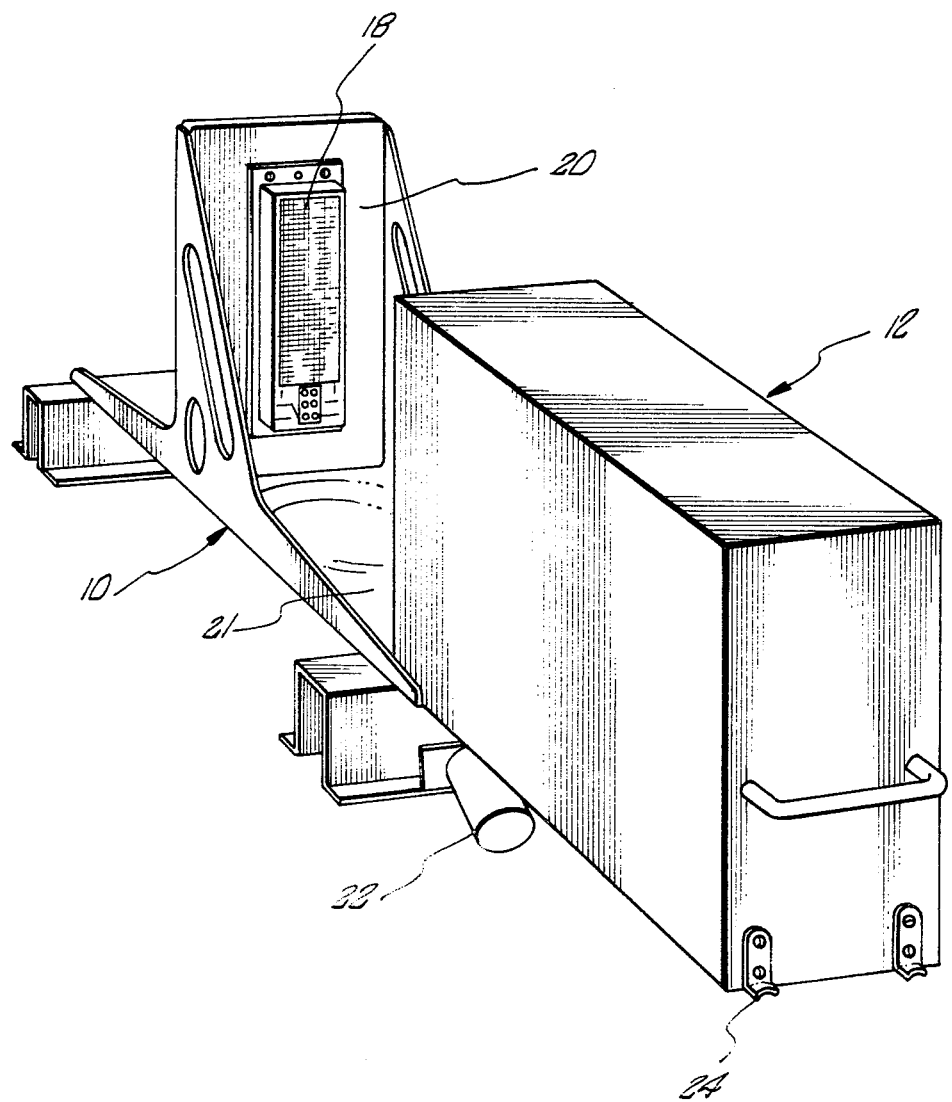
FIG. 1 is a view, in perspective, of a racking system, or "box-and-tray", or modular unit and shelf, combination, incorporating our improved electrical connector structure, the modular unit being shown in position on the shelf before its horizontal motion has been completed to bring the mating portions of the electrical connector together.
Figure 2:
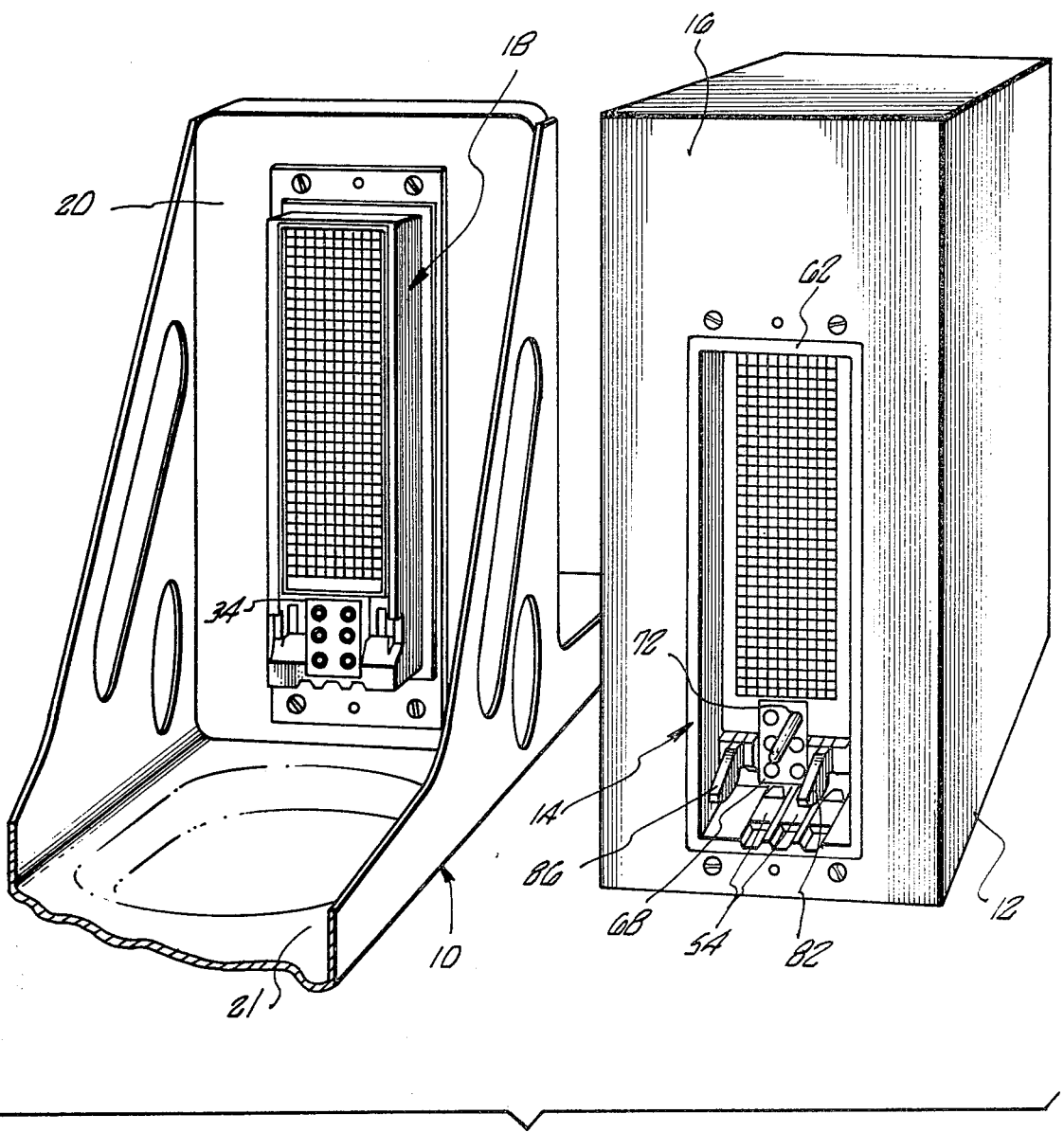
FIG. 2 shows separate perspective views of the modular unit and shelf of FIG. 1, prior to installation of the unit on the shelf, with both connector mating portions visible.

As shown in FIGS. 1 and 2, the racking system includes a supporting shelf, or tray, 10 and a modular removable component 12 supported thereon, which is normally enclosed in a container or box, as shown. The supporting shelf is mounted "in place" on the vehicle, or other equipment, which uses the electrical and electronic systems which are to be interconnected. The most common use of such "box-and-tray" structures is in aircraft. The shelf is permanently mounted on the aircraft, and its connector unit is connected by wires to the electrical and electronic systems which are permanently installed on the aircraft. The box is a modular avionics component which can be readily replaced when necessary, and its connector unit is connected by wires to the electrical and electronic components inside the box. Insertion and removal of the box on the shelf requires readily connectable and disconnectable electrical connector terminals.

The electrical connector shown in FIG. 2 comprises a female, or receptacle, mating portion 14 secured to the end wall 16 of the modular unit 12, and a male, or plug, mating portion 18 secured to the vertical back portion, or backplate, 20 of the shelf 10. The male and female mating portions obviously could be reversed if preferred, with the female portion 14 secured to the backplate and the male portion 18 secured to the end wall of the box. The male and female mating portions should be located near the interface 21 of the shelf and the modular unit, in order to avoid mating problems which could result from deflection of the shelf or backplate under connector insertion forces.

In order to hold the modular unit in position on the shelf after the modular unit has been pushed along the shelf to bring the connector mating portions into their fully mated positions, a suitable hold-down mechanism is required, such as the mechanism disclosed in our U.S. Pat. No. 3,640,141, issued on Feb. 8, 1972. This hold-down mechanism also provides means for exerting insertion and extraction forces for those electrical terminals which require such forces, i.e., the co-axially, or telescopically, engaging terminals. In FIG. 1, a hold-down knob 22 is shown at one end of the shelf, which can be normally hooked to a bracket 24, on the rear wall of the modular unit 12 when the modular unit has been pushed into proximity to the backplate portion 20 of the shelf 10.

Figure 3:
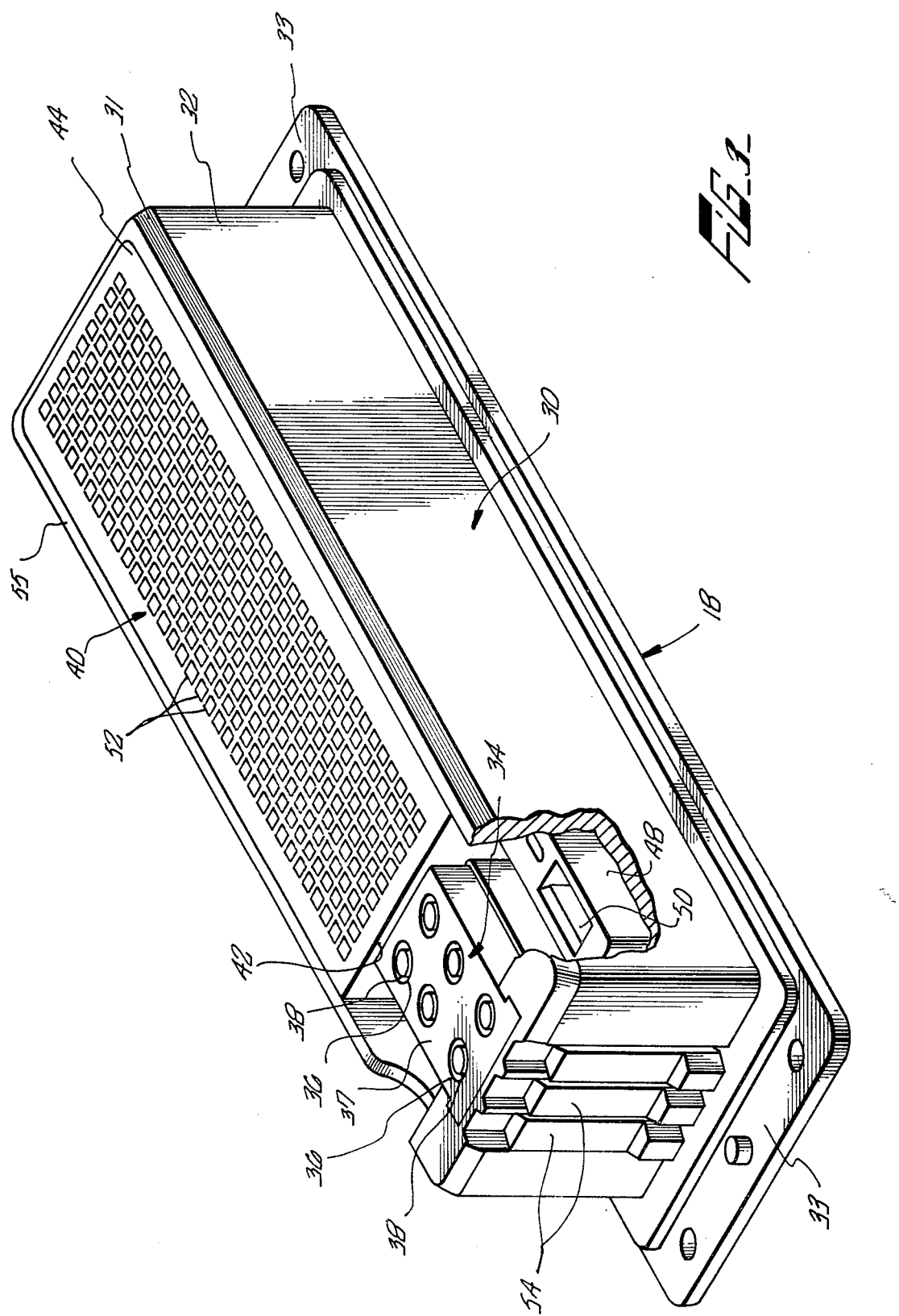
FIG. 3 is a closeup view, in perspective, of the shelf-mounted mating portion of the connector of FIG. 1.

As shown in FIG. 3, the male mating portion 18 of the connector comprises a metal shell, or housing, 30 which is designated to support and enclose the electric terminals contained therein, and also to cooperate with the female portion in guiding the terminals into engaging or overlapping position during the installation of the modular unit on the shelf. In order to facilitate its guiding inter-engagement with the female portion, the outer periphery of the male shell 30 preferably has a chamfered entering edge 31 and tapered side portions 32. The shell 30 has upper and lower flanges 33 by means of which it can be secured to either the modular unit or the shelf.

Supported inside the male shell 30 are at least two electric-terminal-providing members, each of which comprises an insulating support portion and a plurality of terminals carried thereby. One such member 34 is fixedly mounted in the vertically lower, or bottom, part of the shell 30, and has a plurality of bores, or passages, 36 extending through its insulating support portion 37, in each of which passages is mounted one half of a pin-and-socket terminal pair. In the figure, the member 34 in the male shell is shown containing socket elements 38; however, the pin elements could be mounted in the member 34, if preferred. It is desirable that each socket element be held in place by a clip which permits a slight motion of the socket to adjust for any misalignment with its entering pin.

The second electric-terminal-providing member in the male shell is the member 40, located vertically above the member 34. The member 40 is prevented from horizontal movement in the shell, but is permitted limited vertical movement, as shown, by the space 42 between member 40 and member 34. Member 40 preferably has its insulating support portion 44 mounted in a metal holder 46, which slides inside the male shell 30.

Since relative motion between the member 40 and the male shell 30 is preferably caused by a lever, or cam, arrangement, such as that disclosed and claimed in our copending application, Ser. No. 535,288, we have provided two extensions 48 integral with member 40 and extending downwardly therefrom on opposite sides of member 34, each of which extensions 48 has a slot 50 adapted to receive one end of a lever which is carried by the female shell.

Member 40 has a large number of terminal-containing passages 52 extending therethrough. These passages are preferably rectangular in cross-section because each of them houses a terminal element which moves into and out of contact by relative lateral, or transverse, movement with respect to its contacting terminal, i.e., movement at least partially in the plane of, or in a plane parallel to, the interface of the two mating shells (male and female). Details concerning these terminal elements will be explained more fully below. When reference is made herein to "lateral" or "sideward" movement of the terminal elements into contact position, that does not imply horizontal movement. Actually, the movement in the described embodiment is vertical. What is meant is that inter-engagement of the terminals results from their relative motion in a direction which is at least partially transverse, or normal, to the axial or telescoping motion of the shells into mating engagement.

The male shell 30 also carries suitable indexing pins 54, which cooperate with corresponding indexing means on the female portion to prevent accidental interconnection of the wrong modular unit and shelf combination.

Figure 4:
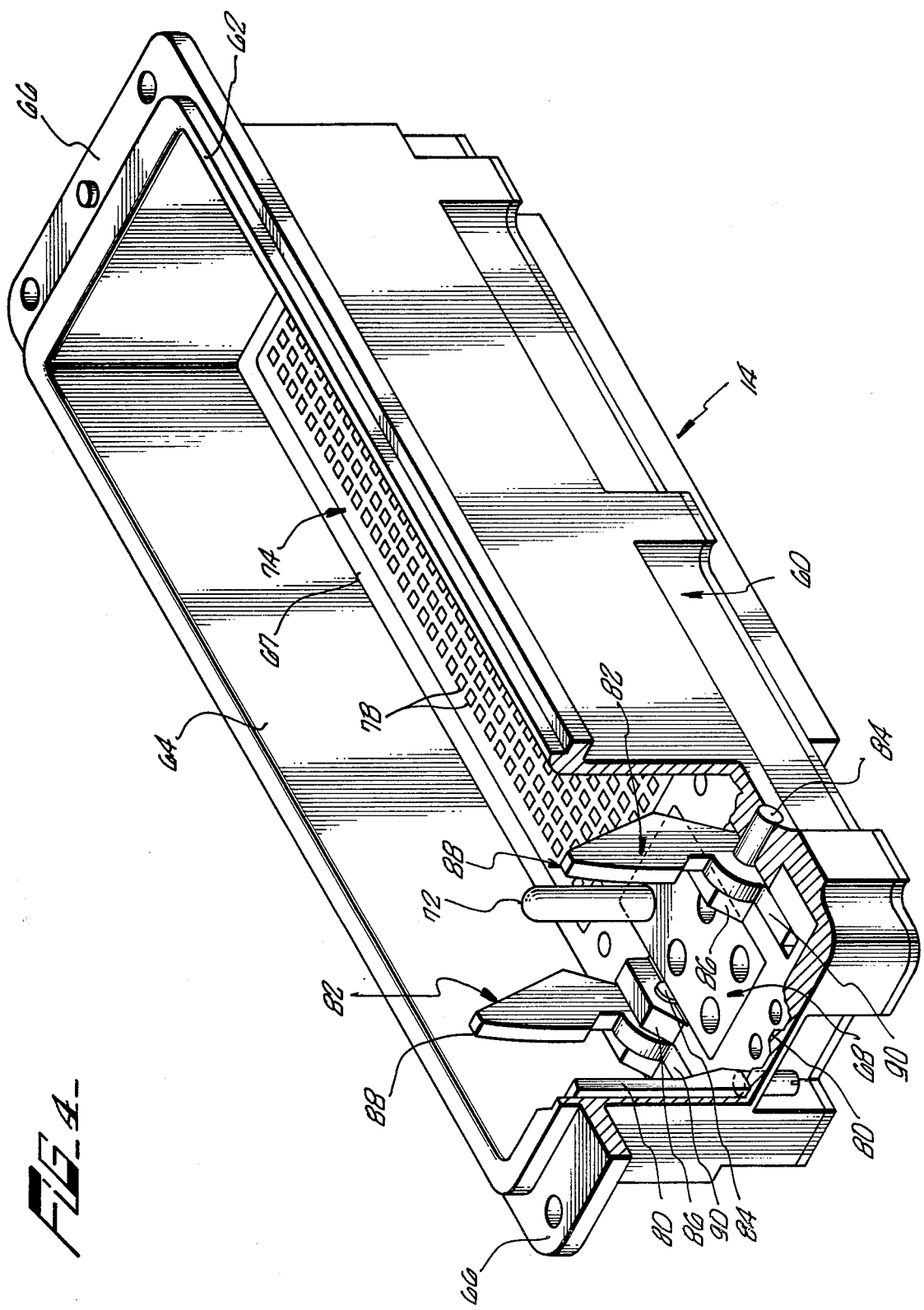
FIG. 4 is a closeup view, in perspective, of the modular-unit-mounted mating portion of the connector of FIG. 1.

As shown in FIG. 4, the female mating portion 14 of the connector comprises a metal shell, or housing 60, which is designed to support and enclose the electrical terminals contained therein, and also to cooperate with the male portion in guiding the terminals into engaging or overlapping positiion during the installation of the modular unit on the shelf. In order to facilitate its guiding inter-engagement with the male portion, the inner periphery of the shell 60 preferably has a convexly-curved edge 62 which initially receives the male shell, and tapered side portions 64. The shell 60 has upper and lower flanges 66 by means of which it can be secured to either the modular unit, or the shelf.

When the male and female shells 30 and 60 are brought together, they provide a close-tolerance fit of the outer periphery of the male shell inside the inner periphery of the female shell, thereby guiding the coaxial, or telescoping, terminals into engagement. Misalignment, if any, between the shells can be compensated for either by a slight lifting of the end of the modular unit nearest the back-plate, or by permitting a slight floating movement of the connector shell mounted on the modular unit. The male and female shells reach their "bottomed", or fully-mated positions when the edge surface 55 on the male shell engages the surface 67 inside the female shell. (Note the locations of the bottoming surfaces 55 and 67 in FIGS. 3 and 4).

Supported inside the female shell 60 are at least two electric-terminal-providing members, each of which comprises an insulating support portion and a plurality of terminals carried thereby. One such member 68 is fixedly mounted in the vertically lower, or bottom, part of the shell 60, and has a plurality of bores, or passages, 70, extending through its insulating support portion 71, in each of which passages is mounted one half of a pin-and-socket terminal pair. In the figure, the member 68 is shown containing pin elements 72 (only one of which is shown, in order not to block other details of the figure). Socket elements, instead of pin elements, could be carried by member 68, if preferred. It is desirable that each of the pin elements 72 be held in place by a clip which permits a slight motion of the pin to adjust for any misalignment with its receiving socket.

The second electric-terminal-providing member in the female shell is the member 74, which is also fixedly mounted in the shell and which is located vertically above the member 68. The insulating support portion 76 of member 74 has a large number of terminal-containing passages 78 extending therethrough. These passages are preferably rectangular in cross-section because each of them houses a terminal element which moves into and out of contact by relative lateral, or transverse, movement with respect to its contacting terminal, i.e., movement at least partially in the plane of, or in a plane parallel to, the interface of the two mating shells (male and female). Details concerning these terminal elements will be explained more fully below.

The female shell 60 carries suitable indexing pins 80 which cooperate with the indexing pins 54 on the male shell.

Two levers 82 are located at opposite sides of the member 68, and are pivotally supported in the female shell by means of pivot pins 84. The projecting ends 86 of these levers enter the slots 50 in movable member 40 in the male shell 30 when the male and female shells are brought into mating position. Engagement of the levers with the movable member 40 in the other shell controls the movement of member 40 either toward or away from fixed member 34; and such movement controls the engagement, and disengagement, of the laterally engaging, low insertion force terminals located in the passages 52 of member 40 (in shell 30) and in the passages 78 of member 74 (in shell 60).

Two identical camming levers 82 are included in order to provide redundancy, so that failure of one lever, for any reason, will still allow the other lever to function as a means of bringing the laterally engaging electric terminals into contact when the modular unit is pushed against the packplate of the shelf.

Figure 5:
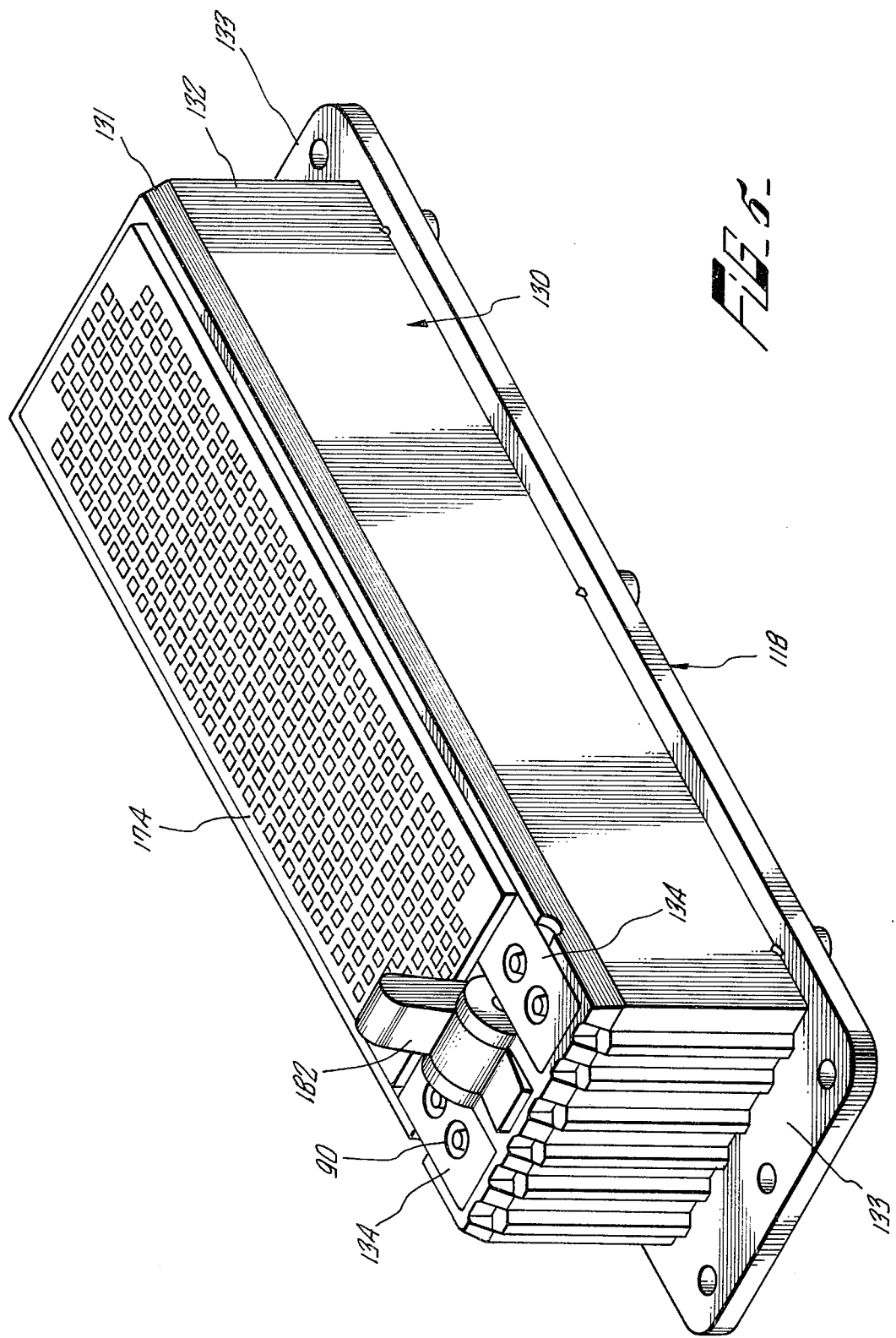
FIGS. 5 through 8 are identical with FIGS. 8 through 11, respectively, of our copending application Ser. No. 535,288, except that the detail-identifying numerals used in the two applications are not the same. The structures shown in FIGS. 5 through 8 are similar, but not identical to, the structures shown herein in FIGS. 1 through 4.
Figure 6:
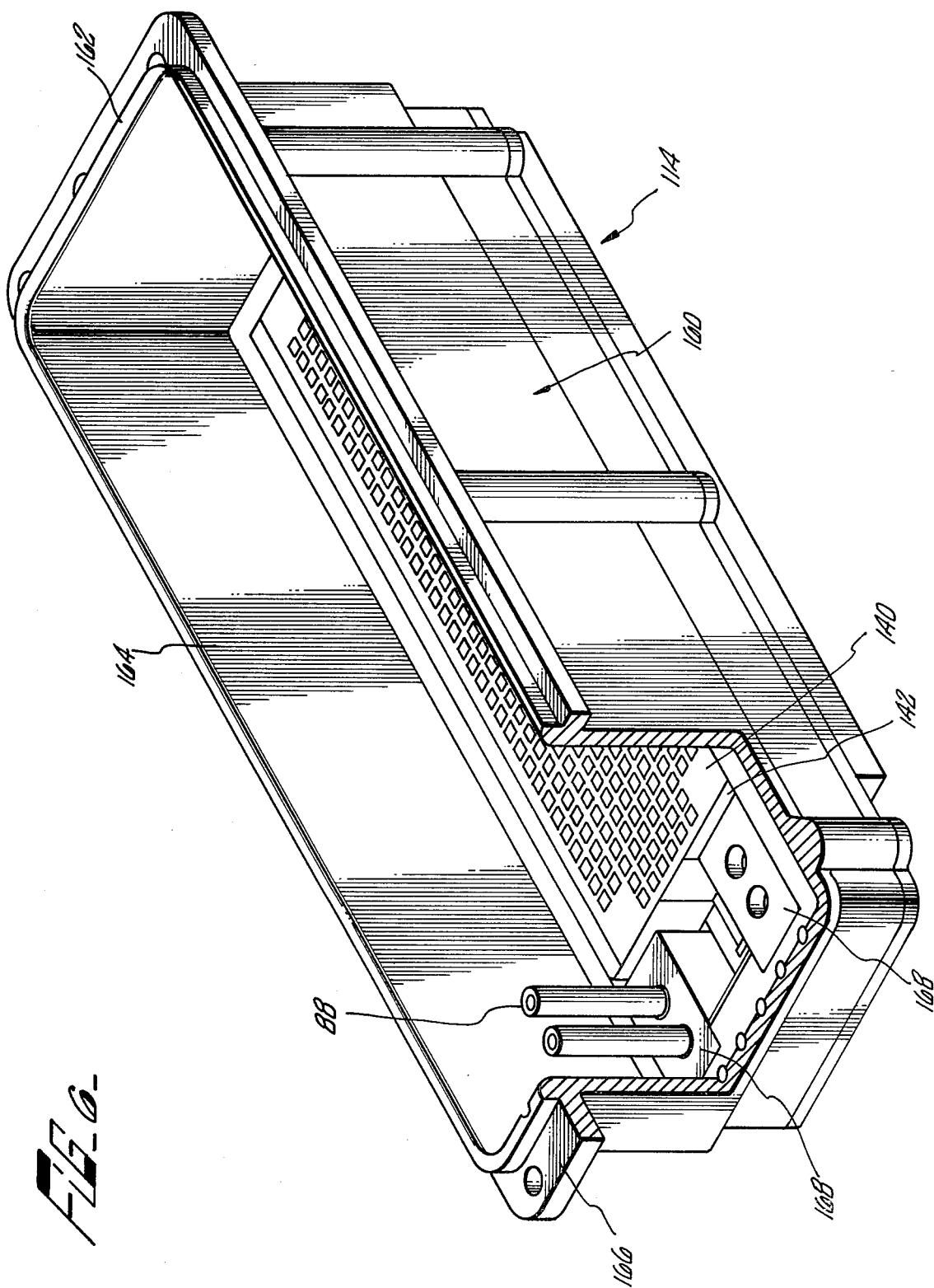
Figure 8:
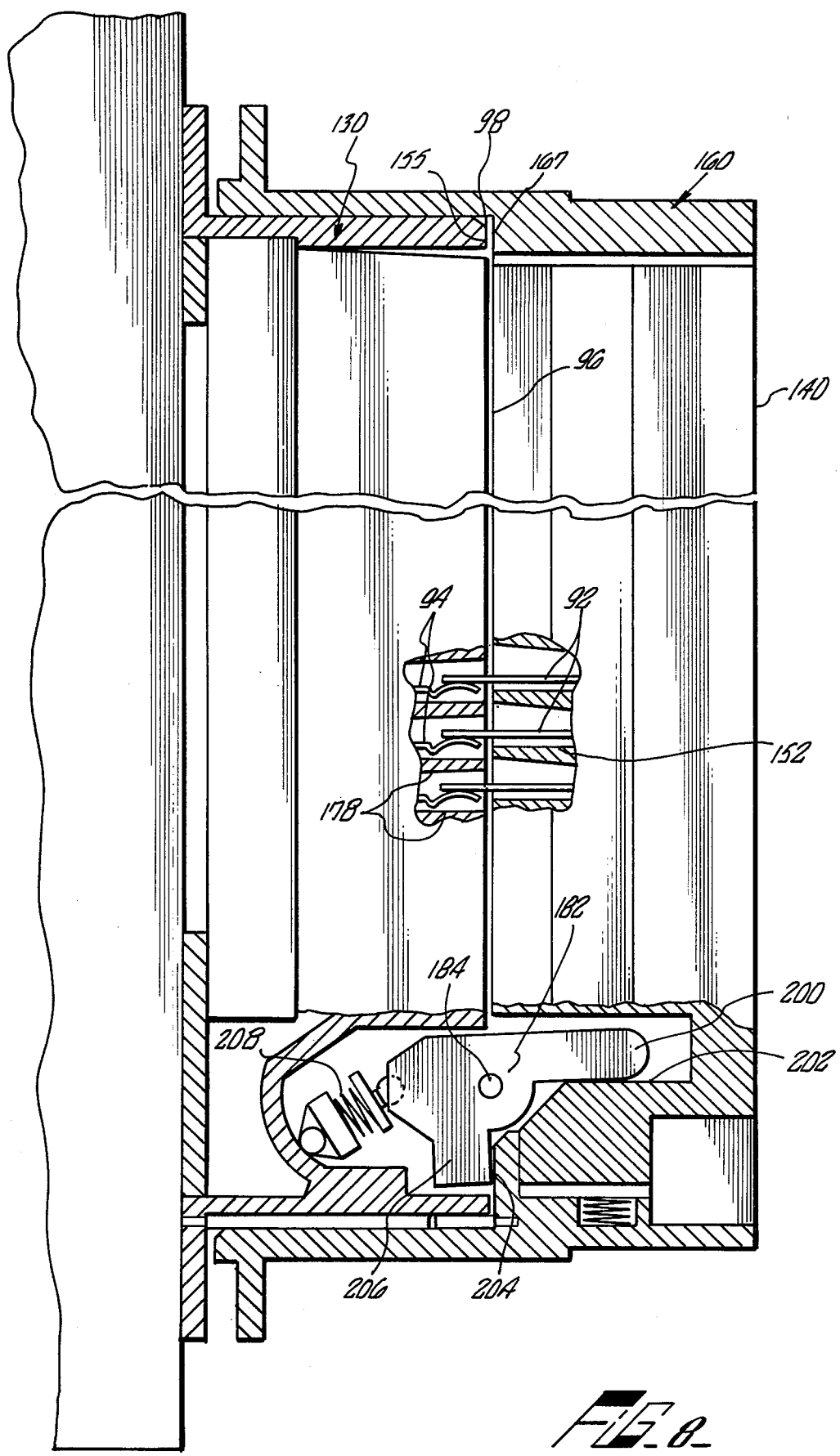

FIGS. 5 and 6, which are the same as FIGS. 8 and 9 of our copending application Ser. No. 535,288, except for identifying numerals, show a male plug, or shell, 118 in FIG. 5 and a female receptacle, or shell, 114, in FIG. 6. These are generally similar to the male and female connector mating portions 18 and 14 of FIGS. 3 and 4. (Because of the close similarity in the functional aspects of the two versions, the numerals in FIGS. 5 and 6 are the same as the numerals applied to similar elements in FIGS. 3 and 4, except that they are higher by the addition of 100 in each case). However, there is only one camming lever 182 shown in FIGS. 5 and 6, and its structure and operation differ somewhat from the levers in FIGS. 3 and 4, although the end results are the same. In both cases relative telescoping movement of the two mating shells into mated position causes the camming lever to move the movable terminal-supporting member in one of the shells laterally, or transversely, into position wherein its terminals engage side-to-side with the corresponding terminals in the other shell. The camming lever 182 shown in FIG. 5 is supported on the male shell 130, instead of the female shell. With the lever 182 supported on the male shell in FIG. 5, it is necessary that the movable insulating support member be mounted inside the famale shell. Specifically, as shown in FIG. 6, an electric-terminal-providing member 140 is movably supported in the female shell 160, i.e., it can move up and down in the shell but is restrained from horizontal movement. The member 140, in the non-mated position of the shells, is separated vertically from the two members 168 in female shell 160 by a space 142.

Because only one centrally located camming lever 182 is used in FIGS. 5 and 6, the pin-and-socket, or telescoping, terminals are supported in two insulating support members 168 located at opposite sides of the camming lever. The terminals shown in FIGS. 5 and 6 are terminals of the co-ax type, i.e., they have two separate electrical paths, one an internal pin and socket connection, and the other a connection in which both terminals are annular. The inner and outer co-ax terminals are separated from one another by an annular insulating wall. One or more of the pin-and-socket connections 72-38, shown in FIGS. 3 and 4, may be combined in the same electric-terminals-providing member (34-68 or 134-168) with one or more of the co-ax terminals 88-90 of FIGS. 5 and 6.

The pin-and-socket connectors 72-38 are generally used as the "power" connectors, i.e., the means for carrying the higher amperages needed to supply electrical power. The co-ax terminals are generally used for low energy signals.

It should be understood that telescoping terminals, or connections, could be used for other purposes than those described; and would in fact be the type of terminals needed if certain other connection functions were performed by the connector mating portions. One such telescoping connector function would be the connection of fiber optics elements. Another would be the connection of gas or liquid conduits, which might be included for cooling purposes. Where telescoping terminals are referred to herein without limitation to electrical terminals, the term is intended to encompass broadly such other types of connections.

Figure 7:
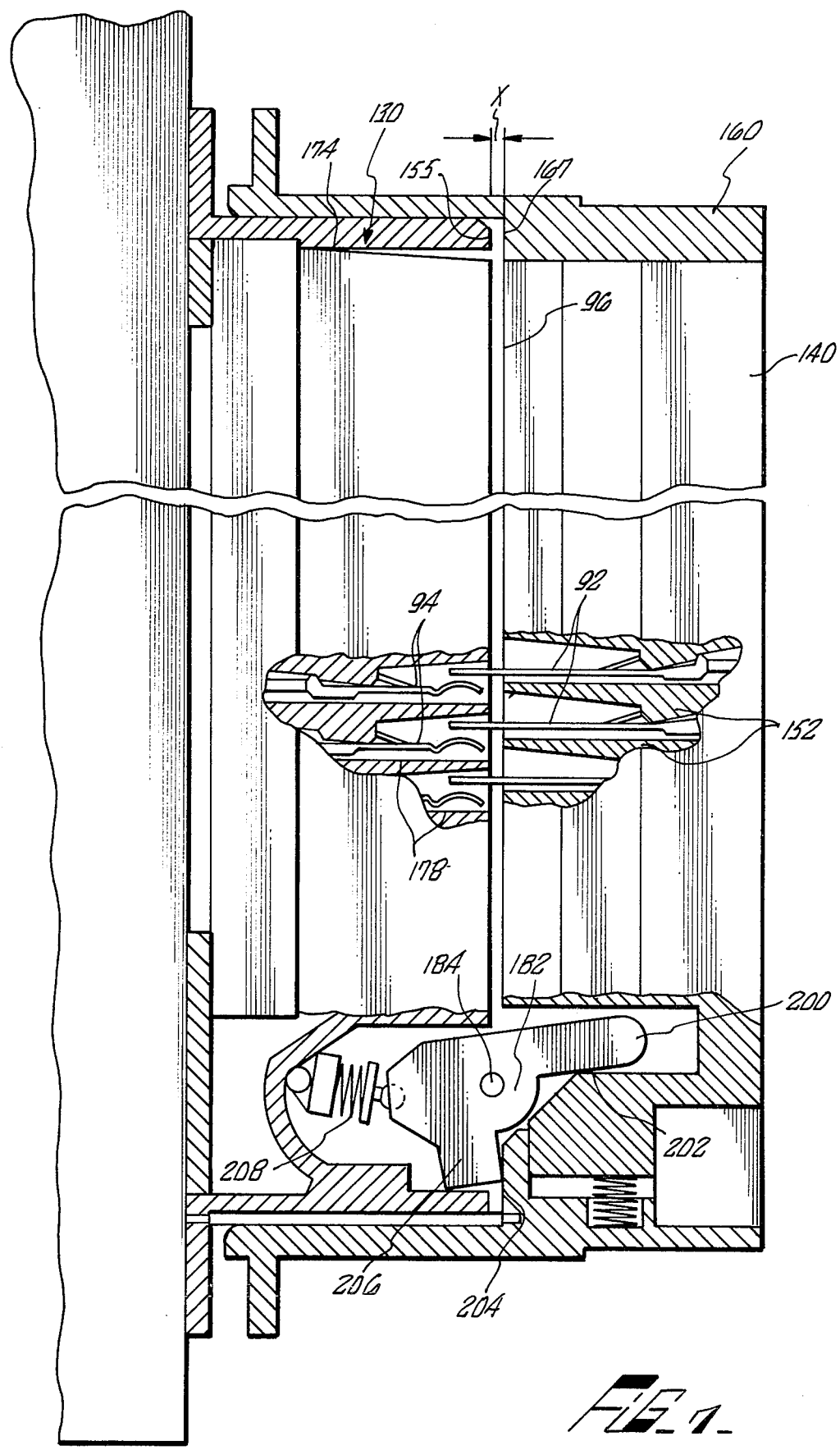

FIGS. 7 and 8, which are the same as FIGS. 10 and 11 of our application Ser. No. 535,288, except for identifying numerals, show in cross-section the male and female shells as they approach mated position. The male and female connector portions of FIGS. 7 and 8 are similar in most respects to those of FIGS. 5 and 6, but they differ in one respect, which will be explained below in the discussion of the "wiping" feature. The functional relationships of the connector portions of FIGS. 7 and 8 are the same as those of the male and female shells of FIGS. 3 and 4. Also FIGS. 7 and 8 show the laterally engaging terminals, which are not shown in the other figures.

In FIGS. 7 and 8, the vertically movable terminal-providing-member 140 in female shell 160 carries a plurality of electric terminals 92 which are supported individually in the passage 152 extending through member 140; and the terminal-providing-member 174 in the male shell 130 carries a plurality of electric terminals 94 which are supported individually in the passages 178 extending through member 174. As shown, the terminals 92 extend beyond the face 96 of member 140 and are aligned with the passages 178 in member 174, so that the terminals 92 extend into the passages 178 as the male and female shells reach the position shown in FIG. 7. They overlap, or overlie, the adjacent ends of terminals 94, but they do not engage them because of the transverse, or (in FIG. 7) vertical, spacing therebetween. In FIG. 8, however, additional motion of the male and female shells toward fully mated position has brought the terminals 92 and 94 into inter-engagement due to the transverse motion in tandem of terminals 92 as their supporting member 140 moves downwardly. This movement is due, in the illustrated version of the invention, to the action of the lever 182.

Either or both terminals of each pair of inter-engaging terminals 92 and 94 is a resilient cantilevered element, or reed, which is laterally deflectible after the terminals 92 and 94 engage. This is necessary to compensate for tolerances and to insure good electrical contact.

In the preferred arrangement, when the terminals 92 and 94 make contact, there is still a horizontal spacing 98 (see FIG. 8) between the surface 155 on the male shell and the surface 167 on the female shell which engage when the mating shells reach bottomed, or fully mated, position. This spacing provides for a "wiping" action, i.e., a relative sliding action of the contacting terminals as the connector shells are "pushed home". This wiping action, which is preferably about 0.015 in. of relative travel, is very useful because it provides a cleaning effect on the terminals to insure good electrical contact. The connector structures shown in FIGS. 3 and 4, and in FIG. 7 and 8, are designed to have this wiping action, which is a desired function. The connector structure shown in FIGS. 5 and 6, which is not now the preferred version, permits the support member 174 mounted in the male shell 130 to have a slight telescoping motion in the shell after the terminals 92 and 94 are moved into engagement, thereby preventing a wiping action.

Operation of lever 182 to bring contacts 92 and 94 into inter-engagement consists essentially of its exertion by its arm 200 of a downward force against surface 202 on movable terminal-supporting member 140, in response to horizontal force exerted by surface 204 of shell 160 against arm 206 on lever 182. This horizontal force, which is caused by pushing the modular unit into position against the backplate, rotates the lever in a counterclockwise direction on its pivot pin 184. An over-center, snap-action, device 208 may be combined with the lever, as shown. This device is fully described in our application Ser. No. 535,288, to which reference may be had for further information. Also, a detailed description of the function of levers 82 of FIG. 4 will be included in another application which is being filed as a second continuation-in-part of application Ser. No. 535,288.

With respect to the camming action required to bring into contact the laterally-engaging, low insertion force terminals 92-94, it should be understood that manually controlled camming action, or in fact any manually controlled action, could be used to move the member 140 into terminal-engaging position without departing from the concept of our invention.

FIG. 9 is a part-sectional view similar to FIG. 7, except that it is sectioned to show the telescoping terminals at the bottom of the connector, as well as the side-engaging terminals. As in FIG. 7, the low insertion force, or side-engaging, terminals 92 and 94 are shown in FIG. 9 in their relative positions just prior to engagement.

The telescoping terminals at this point in the mating of the shells are already engaged, or in contact position, as shown in FIG. 9. Two pin and socket terminal pairs are shown, each comprising a socket element 38 and a pin element 72 extending into the socket element. As shown, both the pins and the sockets are held in position by spring clips 210 which retain them in place in the insulating support members, but permit a slight motion to adjust for any pin and socket misalignment.

At the bottom of FIG. 9, a pair of interengaging co-ax terminal elements 88 and 90 are shown. The element 88 is shown mounted in insulating support member 68 or 168 and has an inner pin 212 and an outer tubular metal conductor 214 separated from the pin by insulation 216. The element 90 is shown mounted in insulating support member 34 or 134 and has a female tubular conductor 218 which is entered by pin 212 and an outer male tubular conductor 220 which is separated from conductor 218 by insulation 222 and which enters and engages the outer conductor 214 of element 88. Thus two separate electrical paths are provided.

Summarizing briefly, from a functional standpoint, it will be apparent that the structural arrangement disclosed herein provides mating electrical connector portions, or shells, which interengage with one another to guide their enclosed terminals into appropriate position; and that each of the mating portions contains both (a) telescoping terminals which are brought into engagement by co-axial insertion and (b) laterally-engaging terminals which are initially moved into overlapping position by parallel motion and thereafter brought into engagement by relative lateral motion. The telescoping terminals, which require substantial insertion force, are located as close as is practically feasible to the deflection-resisting portions of the modular unit and shelf on which the connector mating portions are mounted. This location is also as close as is practically feasible to the line of force of the hold down and latching mechanism which retains the modular unit in place on the shelf.

The following claims are intended to express the inventive scope of applicants' contribution to the art. Various modifications may be made in utilization of the present invention without departing from the spirit and scope of the claimed contribution.

We claim:

1. For use in an electrical connector racking system which comprises a previously installed supporting member adapted to be connected to "in place" electrical equipment, and a modular, readily removable member supported on the supporting member and requiring electrical interconnection with said "in place" equipment; an electrical connector comprising:

a shell adapted to be mounted on the modular member near the bottom thereof;
another shell adapted to be mounted on the supporting member in alignment with the shell on the modular member;
a first electric-terminal-providing member fixedly supported inside one of the shells near the lower end thereof, said first member including an insulating support portion and a plurality of socket terminals carried thereby;
a second electric-terminal-providing member fixedly supported inside the other shell near the lower end thereof, said second member including an insulating support portion and a plurality of pin terminals carried thereby and aligned with the socket terminals;
a third electric-terminal-providing member fixedly supported inside one of the shells above the other such member therein, said third member including an insulating support portion and a plurality of laterally engageable terminals carried thereby;
a fourth electric-terminal-providing member supported inside the other shell above the other such member therein and vertically movable toward and away from it, said fourth member including an insulating support portion and a plurality of laterally engageable terminals carried thereby and movable therewith into and out of engagement with the terminals in the third member;
the outer periphery of one of the shells being dimensioned to closely mate with the inner periphery of the other shell when the two are brought together, thereby guiding the shells as they are brought into mating position and protecting the terminals from forces acting in the plane of the interface of said shells;
at least one terminal each of the pin-and-socket interengaging pairs of terminals having sufficient play relative to its support portion to adjust for terminal misalignment;
at least one terminal of each of the laterally interengaging pairs of terminals having lateral flexibility to deflect after terminal engagement; and
means for moving the fourth member vertically to bring its terminals into engagement with those of the third member after the shells have been moved into mated position.

2. For use in an electrical connector racking system which comprises a previously installed supporting member adapted to be connected to "in place" electrical equipment, and a modular, readily removable member supported on the supporting member and requiring electrical interconnection with said "in place" equipment; an electrical connector comprising:

a shell adapted to be mounted on the modular member;
another shell adapted to be mounted on the supporting member in alignment with the shell on the modular member;
one or more electric terminals of the concentric, telescopically-engaging type secured in one of the shells;
one or more electric terminals of the concentric, telescopically-engaging type secured in the other shell in alignment with an adapted to engage the aforementioned concentric terminals when the two shells are brought together;

a first electric-terminal-providing member including a support portion mounted inside one of the shells and a plurality of side-engaging terminals carried thereby;

a second electric-terminal-providing member including a support portion movably mounted inside the other shell and a plurality of side-engaging terminals carried thereby and adapted to engage the aforementioned side-engaging terminals when moved sideward as the moveable support portion is moved relative to its shell; and means automatically actuated by relative movement of said shells toward one another for moving the moveable support member and its side-engaging terminals into engagement with the corresponding terminals in said first electrical-terminal-providing member.

3. The electrical connector of claim 2 wherein the outer periphery of one of the shells is dimensioned to closely mate with the inner periphery of the other shell when the two are brought together, thereby guiding the shells as they are brought into mating position.

4. The electrical connector of claim 3 wherein at least one terminal of each of the side-engaging pairs of terminals has lateral flexibility to yield afer terminal engagement.

5. The electrical connector of claim 3 wherein at least on terminal of each of the telescopically-engaging pairs of terminals has sufficient play relative to its shell to adjust for terminal misalignment.

6. The electrical connector of claim 2 wherein the two shells are so mounted as to be near the surface of the supporting member which supports the modular. member.

7. The electrical connector of claim 3 wherein the two shells are so mounted so as to be near the surface of the supporting member which supports the modular member.

8. The electrical connector of claim 6 wherein the telescopically-engaging terminals are mounted in the portions of their respective shells near the surface of the supporting member which supports the modular member.

9. The electrical connector of claim 7 wherein the telescopically-engaging the terminals are mounted in the portions of their respective shells near the surface of the supporting member which supports the modular member.

10. The electrical connector of claim 2 wherein the laterally interengaging terminals come into interengaging position prior to mating of said shells and thereafter are wiped over one another by the motion of the shells into final mating position.

11. For use in an electrical connector racking system which comprises a previously installed supporting member adapted to be connected to "in place" electrical equipment, and a modular, readily removable member supported on the supporting member requiring electrical interconnection with said "in place" equipment; an electrical connector of low insertion force comprising:

a shell adapted to be mounted on the modular member near the bottom thereof;

another shell adapted to be mounted on the supporting member in alignment with the shell on the modular member;

a first telescoping-electric-terminal-providing member fixedly supported inside one of the shells near the lower end thereof, said first telescoping member including an insulating support portion and a plurality of socket terminals carried thereby;

a second telescoping-electric-terminal-providing member fixedly supported inside the other shell near the lower end thereof, said second telescoping member including an insulating support portion and a plurality of pin terminals carried thereby and aligned with the socket terminals;

a first electric-terminal-providing member fixedly supported inside a first of the shells above the telescoping-electrical-terminal-providing member therein, said first electrical-terminal-providing member including an insulating support portion and a first plurality of laterally engageable terminals carried thereby;

second electric-terminal-providing member supported inside the second of the shells above the telescoping-electrical-terminal-providing member therein and vertically movable within said second shell, said second electric-terminal-providing member including an insulating support portion and a second plurality of laterally engageable terminals carried thereby and movable therewith into and out of engagement with said first plurality of laterally engaging terminals;

the outer periphery of one of the shells being dimensioned to closely mate with the inner periphery of the other shell when the two are brought together, thereby guiding the shells as they are brought into mating position and protecting the terminals from forces acting in the plane of the interface of said shells;

at least one terminal of each of the pin-and-socket interengaging pairs of terminals having sufficient play relative to its support portion to adjust for terminal misalginment;

at least one terminal of each of the laterally interengaging pairs of terminals having lateral flexibility to deflect after terminal engagement; and means automatically actuated by relative movement of said shells toward one another for automatically moving the second electric-terminal-providing member vertically toward a position where its terminals are in engagement with those of the first electric-terminal-providing member.

12. For use in an electrical connector racking system which comprises previously installed supporting member adapted to be connected to "in place" electrical equipment, and a modular, readily removable member supported on the supporting member and requiring electrical interconnection with said "in place" equipment; an electrical connector comprising:

a shell adapted to be mounted on the modular member;

another shell adapted to be mounted on the supporting member in alignment with the shell on the modular member;

one or more terminals of the concentric, telescopically-engaging type secured in one of the shells;

one or more terminals of the concentric, telescopically-engaging type secured in the other shell in alignment with and adapted to engage the aforementioned concentric terminals when the two shells are brought together;

a first electric-terminal-providing member including a support portion mounted inside one of the shells and a plurality of side-engaging terminals carried thereby;

a second electric-terminal-providing member including a support portion movably mounted inside the other shell and a plurality of side-engaging terminals carried thereby and adapted to engage the aforementioned side-engaging terminals when moved sideward as the movable support portion is moved relative to its shell;

means in the shell containing said first terminal-providing member for moving the movable support member and its side-engaging terminals into engagement with the corresponding side-engaging terminals of said second terminal-providing member after the two shells have been at least partially brought together; and means in the shell containing said second terminal-providing member and responsive to movement of said shells toward one another for automatically controlling the action of said moving means to cause said engagement.

13. The electrical connector of claim 11 wherein said means for moving comprises a pivoted lever means and wherein said controlling means comprises contoured surface means for driving said lever means.

14. The electrical connector of claim 11 wherein said controlling means causes mating before the shells are fully engaged and thereby effects wiping between the side-engaging terminals of said first and second electric-terminal-providing members.

* * * * *